(12) United States Patent
Nagerl et al.

(10) Patent No.: US 6,459,164 B2
(45) Date of Patent: Oct. 1, 2002

(54) APPARATUS FOR SEALING A BALL GRID ARRAY PACKAGE AND CIRCUIT CARD INTERCONNECTION

(75) Inventors: Andrew J. Nagerl, Owego; John B. Felice, Newark Valley, both of NY (US)

(73) Assignee: Lockheed Martin Corporation, Owego, NY (US)

( * ) Notice: Subject to any disclaimer, the term of this patent is extended or adjusted under 35 U.S.C. 154(b) by 0 days.

(21) Appl. No.: 09/791,338

(22) Filed: Feb. 23, 2001

Related U.S. Application Data

(62) Division of application No. 09/494,950, filed on Feb. 1, 2000, now Pat. No. 6,214,650.

(51) Int. Cl.[7] .......................... H01L 23/29; H01L 21/50
(52) U.S. Cl. ........................................ 257/795; 438/127
(58) Field of Search ................................ 257/678, 687, 257/731, 740, 783, 789, 795; 438/127, 112, 124, 126, 125

(56) References Cited

U.S. PATENT DOCUMENTS

| | | | |
|---|---|---|---|
| 5,448,114 A | 9/1995 | Kondoh et al. | 257/778 |
| 5,523,628 A * | 6/1996 | Williams et al. | 257/777 |
| 5,583,378 A | 12/1996 | Marrs et al. | 257/710 |
| 5,629,835 A * | 5/1997 | Mahulikar et al. | 361/719 |
| 5,650,593 A | 7/1997 | McMillan et al. | 174/52.4 |
| 5,834,339 A * | 11/1998 | Distefano et al. | 438/125 |
| 5,930,597 A * | 7/1999 | Call et al. | 438/106 |
| 6,107,123 A | 8/2000 | Distefano et al. | 438/125 |

FOREIGN PATENT DOCUMENTS

| | | |
|---|---|---|
| JP | 54161271 | 12/1979 |
| JP | 56158460 | 12/1981 |

* cited by examiner

*Primary Examiner*—Caridad Everhart
*Assistant Examiner*—Calvin Lee
(74) *Attorney, Agent, or Firm*—Perkins, Smith & Cohen, LLP; Jerry Cohen; Jacob N. Erlich

(57) ABSTRACT

The present invention provides an electronic package assembly in which a ball grid array (BGA) is surface mounted to a printed wiring board using solder balls. Tubing is placed along the perimeter of the BGA housing to prevent subsequently applied sealant from contacting the solder balls or filling the gap between the BGA housing and the printed wiring board. This results in a seal that prevents electrical disconnection in the solder joint during operation of the electronic package assembly.

12 Claims, 1 Drawing Sheet

APPARATUS FOR SEALING A BALL GRID ARRAY PACKAGE AND CIRCUIT CARD INTERCONNECTION

CROSS REFERENCE TO RELATED APPLICATIONS

This application is a divisional application of U.S. Ser. No. 09/494,950 filed Feb. 1, 2000 now U.S. Pat. No. 6,214,650 entitled METHOD AND APPARATUS FOR SEALING A BALL GRID ARRAY PACKAGE AND CIRCUIT CARD INTERCONNECTION and priority is claimed thereof.

FIELD OF THE INVENTION

This invention relates generally to electronic packaging assemblies, and more particularly, to ball grid array packages that are surface mounted on printed wiring boards.

BACKGROUND OF THE INVENTION

Electronic package assemblies which utilize various substrates (e.g. printed wiring boards comprised of conductive structures in epoxy resin or the like material) having one or more electronic packages surface mounted thereon are known. Typically, such electronic package assemblies include a relatively flat housing component having therein at least one semiconductor device, which semiconductor device is in turn electrically connected to various conductive leads which project from designated sides of the housing component. One such example is known in the art as a "flat pack." Electronic package assemblies provide various functions (e.g. memory, logic) for the overall system which utilizes package assemblies of this type.

Typically, the conductive leads which project from electronic package assemblies are electrically coupled to respective conductive pads that form the circuitry on an upper surface of a printed wiring board. As is known, various solder compositions may be used to provide individual electrical interconnections between respective pairs of leads and conductors.

In high reliability applications where high levels of humidity can be present (e.g. aircraft flight management computers), these electrical interconnections must be protected from the harmful effects of moisture (e.g. corrosion caused by condensation). Also, these interconnections must be protected from shorting out by the potential presence of loose foreign conductive particles. In the current art, various organic coatings (e.g. epoxy, acrylic, paraxylylene) are applied as a thin, continuous film to the leads, solder and conductive pads by various techniques (e.g. spray, dip, vapor deposition) so as to provide a barrier to moisture and foreign conductive particles.

Recently, electronic package assemblies have been developed which use small solder balls (typically 0.025 inches in diameter) instead of leads to provide an electrical interconnection between the package and the circuit board. These solder balls are arranged in an array (typically 0.050 inch on center) under the electronic package housing. Such packages are referred to in the art as "ball grid arrays" (BGAs). BGA devices, having many more interconnections than a leaded electronic package with the same housing dimensions, allow for greater input/output capability. BGA devices also eliminate the need to route package leads to the outer edges of the electronic package. Finally, BGA devices provide shorter interconnect lengths which result in improved electrical performance. The advantages described above, along with the low cost of ball grid array packaging, make BGA devices an ideal packaging format for many integrated circuit applications. Furthermore, these BGA devices are capable of being surface mounted to the substrate's respective circuitry (e.g. conductive pads) using known techniques, e.g. soldering.

When using a spray technique to apply coatings (e.g. epoxy, acrylic) to printed wiring board assemblies which have BGA devices mounted thereon, most of the BGA solder balls are left uncoated due to shadowing effects of the housing. Also, some coating material can fill or bridge the gap between the housing and the printed wring board while some solder balls are left partially coated. "Coating bridges" and partially coated solder balls can also occur when using a dip technique to apply coatings due to the small gap between the housing and the printed wiring board combined with the large housing length and width. It has been discovered that when solder balls are partially coated or coating bridges are present, relatively significant stress is placed on the solder ball interconnection. The stress can adversely effect such interconnections, possibly causing separation of the interconnection. Such resulting separation in turn may cause disconnection between the solder ball and the printed wiring board, possibly rendering the package partially inoperative. Such stress is caused during operation of the package as a result of relatively substantial difference in the coefficient of thermal expansion of the solder and the coefficient of thermal expansion of the coating.

One method of coating BGA solder balls that could provide a thin, continuous and uniform coating on all solder balls without filling or bridging the gap between the housing and the printed wiring board is to apply paraxylylene (e.g. Parylene D from Union Carbide Corporation) using a vapor deposition process.

The cost of performing this process however, can be relatively high, requiring complex and expensive equipment. Also, paraxylylene coatings are very difficult to repair.

It is therefore an object of this invention to enhance the electronic package assembly art.

It is another object of this invention to provide an apparatus for sealing a BGA and printed wiring board interconnection against the effects of moisture and foreign conductive particles which obviates the aforementioned thermal stress problem.

SUMMARY OF THE INVENTION

The objects set forth above as well as further and other objects and advantages of the present invention are achieved by the embodiments of the invention described hereinbelow.

The present invention provides an electronic package assembly in which a ball grid array (BGA) is surface mounted to a printed wiring board using solder balls. Tubing is placed along the perimeter of the BGA housing to prevent subsequently applied sealant from contacting the solder balls or filling the gap between the BGA housing and the printed wiring board. The method of this invention includes the steps necessary to effect such a sealer being incorporated within the electronic package assembly. This results in a seal that prevents electrical disconnection in the solder joint during operation of the electronic package assembly.

The present invention together with the above and other advantages may best be understood from the following detailed description of the embodiments of the invention illustrated in the drawings, wherein:

DETAILED DESCRIPTION OF PREFERRED EMBODIMENTS

Figure 1:
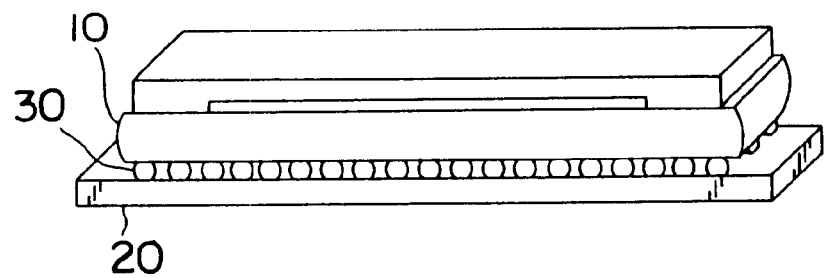
FIG. 1 is a partial cross-sectional pictorial view of a ball grid array (BGA) assembly prior to having tubing and sealant added thereto.

Referring to FIG. 1, there is shown a partial pictorial view of an electronic package assembly, including a ball grid array (BGA) housing 10 mounted on a substrate, in this case a printed wiring board 20. The BGA housing 10 holds an electrical device. The electrical interconnection between the BGA housing 10 and the printed wiring board consists of solder balls 30. The BGA holds a semiconductor device. Details of the BGA and printed wiring board (e.g. semiconductor device, conductor pads, circuitry, solder joint) are not shown because they are conventional in the art.

Figure 2:
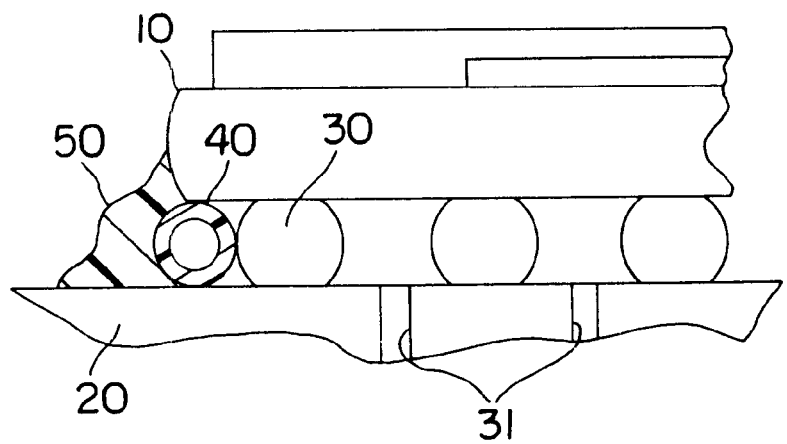
FIG. 2 is a partial cross-sectional side elevational view, in section and on a much enlarged scale over the view of FIG. 1, illustrating one of the sides of the BGA assembly having a sealer in the front of tubing and sealant in place.

Referring to FIG. 2, there is shown a sectional side view of the electronic package assembly of FIG. 1 with tubing and sealant in accordance with a preferred embodiment of the invention.

The gap between the BGA housing 10 and the printed wiring board 20 can be for example 0.035 inch (on a 32 mm BGA package). The BGA housing 10 has a perimeter that generally extends past the outer row of solder balls 30. In accordance with the teachings of the invention, a length of tubing 40 is placed between the BGA housing 10 and the printed wiring board 20. The tubing 40 extends the full length of the BGA housing 10 (from corner to corner) and is applied to all of the four sides of the BGA housing 10. In other words, the tubing extends the full perimeter of the BGA housing whether in sections or as a continuous tube. Following the application of the tubing, a continuous bead of sealant 50 is dispensed along all of the four sides of the BGA housing 10. As shown in FIG. 2, the bead of sealant 50 is attached to the edge of the BGA housing 10 and the printed wiring board 20. Because of the presence of tubing 40, sealant 50 does not contact the solder balls and cannot fill the gap between the BGA housing 10 and the printed wiring board 20.

Following the dispensing of sealant as described above, sufficient time, as set forth with the example provided below, must be spent at room temperature to allow the sealant to gel up enough so that upon subsequent placement of the assembly in a hot air oven for the purpose of curing the sealant, no air bubbles or voids in the sealant will be caused by the air pocket under the BGA housing 10 expanding while in the oven and blowing-out the sealant. Optionally, if a plated through-hole 31 or other hole is provided in the printed wiring board 20 below the BGA (e.g. a hole not filled with solder or coating), then while in the hot air oven, the expanding air can escape without blowing out the sealant and the room temperature gel time can be eliminated. Leaving the plated through-hole open after the sealant has cured should not cause moisture or foreign particle contamination concern due to its small size.

In a preferred embodiment of the invention, the tubing is made of a plastic or rubber with sufficient flexibility (e.g. low modulus of elasticity and thin walled) so as not to impart any significant forces to the solder balls 30 once installed. The tubing outer diameter should be chosen so that it is slightly larger than the gap between the BGA housing 10 and the printed wiring board 20. For example, a polyimide tubing with an outer diameter of 0.038 inch and 0.001 inch wall thickness has been successfully used on 32 mm BGA packages.

Figure 3:
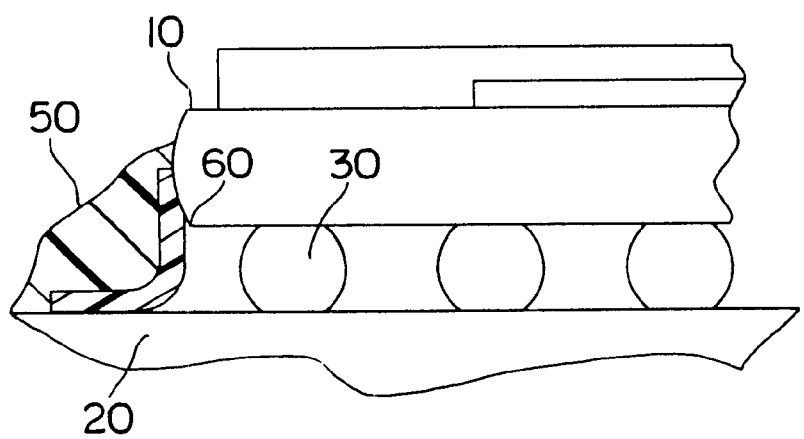
FIG. 3 is similar to the view in FIG. 2, showing another embodiment of the invention using tape in conjunction with sealant.

This invention is not limited to the use of the above tubing, however, in that other methods may be successfully used herein. A soft solid rubber or foam strip with round or other cross-sectional shapes may be used. Also, as shown in FIG. 3, a strip of tape 60 can be applied to the edge of the BGA housing 10 and the printed wiring board 20 so as to prevent the sealant 50 from contacting the solder balls 30 or filling the gap between the BGA housing 10 and the printed wiring board 20.

A preferred sealant has sufficient flexibility (e.g. low modulus of elasticity) so as not to impart any significant forces to the solder balls during operation of the package as a result of relatively substantial differences in the coefficient of thermal expansion of the solder and the coefficient of thermal expansion of the sealant. By way of example, one such sealant is available from Ciba-Geigy Corporation and sold under the trade name of Uralane 5753. This sealant has a modulus of elasticity at room temperature of 300 psi. If filled with approximately 6% by weight of fumed silica, the viscosity of Uralane 5753 can be increased so that it can be dispense along the edges of the BGA without slumping. If air cured at room temperature (approximately 25° C.) for 10 hours, Uralane 5753 will have gelled up sufficiently to prevent voiding before final curing for 5 hours in a hot air oven set to 100° C. This invention is not to be limited to use of the above sealant material, however, in that other sealants may be successfully used herein.

It is to be understood that the above-described embodiments are simply illustrative of the principles of the invention. Various and other modifications and changes may be made by those skilled in the art which will embody the principles of the invention and fall within the spirit and scope thereof.

What is claimed is:

1. An electronic package assembly wherein an electronic device is surface mounted to a substrate using a ball grid array, comprising:

a filling material filling a gap between the electronic device and the substrate, said filling material having sufficient flexibility so as to impart substantially no significant forces to the ball grid array, said filling material providing substantially no mechanical support for the electronic device and forming a protective perimeter around the ball grid array; and a sealant bead applied around the surface mounted electronic device, said sealant bead covering said filling material, and said filling material preventing said sealant from contacting solder balls of said ball grid array.

2. The electronic package assembly of claim 1 wherein the filling material is elastic.

3. The electronic package assembly of claim 1 wherein the filling material is a length of tubing.

4. The electronic package assembly of claim 3 wherein said length of tubing is round in cross-section.

5. The electronic package assembly of claim 3 wherein said length of tubing is oval in cross-section.

6. The electronic package assembly of claim 1 wherein said filling material is a length of solid elastic material.

7. The electronic package assembly of claim 6 wherein said solid elastic material is rubber.

8. The electronic package assembly of claim 6 wherein said length of solid elastic material is round in cross-section.

9. The electronic package assembly of claim 6 wherein said length of solid elastic material is oval in cross-section.

10. The electronic package assembly of claim 6 wherein said length of solid elastic material is rectangular in cross-section.

11. The electronic package assembly of claim 1 wherein said filling material is a length of tape.

12. The electronic package assembly of claim 1 wherein said filling material is a foam material.

* * * * *